(12) United States Patent
Chung et al.

(10) Patent No.: US 9,832,882 B2
(45) Date of Patent: *Nov. 28, 2017

(54) METHOD FOR MAKING CONDUCTIVE PATTERN AND CONDUCTIVE PATTERN

(71) Applicant: INKTEC Co., Ltd., Gyeonggi-do (KR)

(72) Inventors: Kwang-Choon Chung, Gyeonggi-do (KR); Ji Hoon Yoo, Gyeonggi-do (KR); Joonki Seong, Gyeonggi-do (KR); Dae Sang Han, Seoul (KR); Nam-Boo Cho, Gyeonggi-do (KR)

(73) Assignee: INKTEC CO., LTD., Gyeonggi-Do (KR)

(*) Notice: Subject to any disclaimer, the term of this patent is extended or adjusted under 35 U.S.C. 154(b) by 234 days.

This patent is subject to a terminal disclaimer.

(21) Appl. No.: 14/480,250

(22) Filed: Sep. 8, 2014

(65) Prior Publication Data

US 2015/0068787 A1 Mar. 12, 2015

(30) Foreign Application Priority Data

Sep. 6, 2013 (KR) ........................ 10-2013-0107309

(51) Int. Cl.
*H05K 3/12* (2006.01)
*H05K 3/10* (2006.01)
(Continued)

(52) U.S. Cl.
CPC ........... *H05K 3/1258* (2013.01); *H05K 1/095* (2013.01); *H05K 3/06* (2013.01);
(Continued)

(58) Field of Classification Search
None
See application file for complete search history.

(56) References Cited

U.S. PATENT DOCUMENTS

| 6,051,448 A * | 4/2000 | Hayama | H01F 41/043 438/108 |
| 2007/0059939 A1 * | 3/2007 | Chapman | H01L 27/1292 438/719 |

(Continued)

FOREIGN PATENT DOCUMENTS

| CN | 1010103888 A | 8/2007 |
| CN | 101573775 A | 11/2009 |

(Continued)

OTHER PUBLICATIONS

Office Action dated Jun. 23, 2015 in Japanese Application No. 2014-182524.

(Continued)

*Primary Examiner* — Shamim Ahmed
(74) *Attorney, Agent, or Firm* — Saliwanchik, Lloyd & Eisenschenk

(57) ABSTRACT

Provided herein is a conductive pattern making method and conductive pattern, the method including forming a groove such that its width in an inlet area is bigger than its width in an inner area; filling the groove with a conductive ink composition; and drying the conductive ink composition so that a solvent contained in the conductive ink composition inside the groove is volatilized to reduce the volume of the conductive ink composition.

8 Claims, 7 Drawing Sheets

(51) Int. Cl.
*H05K 1/02* (2006.01)
*H05K 1/09* (2006.01)
*H05K 3/06* (2006.01)

(52) U.S. Cl.
CPC ........... *H05K 2201/0376* (2013.01); *H05K 2201/0382* (2013.01); *H05K 2201/09036* (2013.01); *H05K 2201/09827* (2013.01); *H05K 2203/1173* (2013.01); *Y10T 29/49155* (2015.01)

(56) References Cited

U.S. PATENT DOCUMENTS

| | | | | |
|---|---|---|---|---|
| 2007/0220744 | A1* | 9/2007 | Kitaoka | H05K 3/4614 |
| | | | | 29/846 |
| 2007/0289483 | A1* | 12/2007 | Cho | C09D 11/322 |
| | | | | 106/31.13 |
| 2010/0065862 | A1* | 3/2010 | Ray | B82Y 20/00 |
| | | | | 257/88 |
| 2010/0140564 | A1* | 6/2010 | Overbreek | C09D 11/101 |
| | | | | 252/514 |
| 2011/0042125 | A1* | 2/2011 | Lee | C23C 18/08 |
| | | | | 174/250 |
| 2012/0251736 | A1* | 10/2012 | Hong | C09D 11/52 |
| | | | | 427/559 |
| 2012/0315495 | A1* | 12/2012 | Lopez Quintela | C09D 7/1266 |
| | | | | 428/463 |
| 2014/0377455 | A1* | 12/2014 | Chung | H05K 3/1258 |
| | | | | 427/98.4 |

FOREIGN PATENT DOCUMENTS

| | | | |
|---|---|---|---|
| CN | 103268780 | A | 8/2013 |
| CN | 104919572 | A | 9/2015 |
| JP | 09330843 | A | 12/1997 |
| JP | 2004110117 | A | 4/2004 |
| JP | 2009286113 | A | 12/2009 |
| JP | 2013108005 | A | 6/2013 |
| KR | 10-2006-0030473 | A | 2/2008 |
| KR | 10-2009-0025894 | * | 3/2009 |
| KR | 10-2013-0002636 | A | 1/2013 |
| WO | WO-2006093398 | A | 9/2006 |
| WO | WO-2008/063610 | A2 | 5/2008 |

OTHER PUBLICATIONS

Office Action dated Sep. 27, 2016 in Chinese Application No. 201410455312.1.
Office Action dated May 24, 2017 in Chinese Application No. 201410455312.1, along with its English translation.

* cited by examiner

METHOD FOR MAKING CONDUCTIVE PATTERN AND CONDUCTIVE PATTERN

CROSS-REFERENCE TO RELATED APPLICATION

This application claims the benefit under 35 U.S.C. §119 of Korean Patent Applications No. 10-2013-0107309, filed on Sep. 6, 2013, which is hereby incorporated by reference in its entirety.

BACKGROUND

Field of the Invention

The following description relates to a conductive pattern making method and a conductive pattern, and more particularly, to a conductive pattern making method and a conductive pattern that is capable of easily adjusting the electrical characteristics and optical characteristics with improved process efficiency.

Description of Related Art

Recently, as various home appliances and communications apparatuses are becoming digitalized and show improved performance, together with the rapid expansion of the display field, a technology of forming a conductive transparent substrate having a low resistance and high transmissivity is gathering attention.

Such a conductive transparent substrate must be made of a material that is transparent but also has a low resistance, and that exhibits a high flexibility to provide mechanical stability. It must also have a similar coefficient of thermal expansion as that of the substrate, so as to prevent a device from being circuit-shorted and prevent a significant change in the sheet resistance, even when the device is overheated or is subject to a high temperature.

Suitable materials to be used in a conductive transparent substrate include metal oxides, CNT (carbon nanotube), graphene, high molecule conductor, and metal nano wire etc. Of these materials, ITO (indium tin oxide) is most frequently used to form a thin film layer in a vacuum method. However, ITO (indium tin oxide) is a ceramic material that has a low resistance to bending or curving of the substrate, and thus a crack can be easily formed and propagated, thereby deteriorating the characteristics of the electrode. Furthermore, activating through substitution of a tin dopant is difficult, and the defects of its amorphousness exhibit a high sheet resistance. Not only that, the cost of indium which is the main material of ITO continues to increase due to the rapid expansion of the flat panel display, mobile device, and touch panel markets, and the limited reserves of indium is deteriorating the price competitiveness of transparent conductive films. Therefore, in order to gain the upper hand in the display technology competition that is expected to be fierce in the years to come, it is very important to develop an alternative material that can resolve the aforementioned problems of an ITO electrode.

When using a polymer conductor to make a transparent conductive film, materials such as polyacetylene, polypyrrole, polyphenol, polyaniline, and PEDOT:PSS are used, but these polymer conductors have low solubility, are difficult to process, and emit colors when the energy gap is 3 eV or less. A substrate coated with a thin film in order to increase the transmissivity increases the sheet resistance, which may be a problem when using the substrate as a transparent electrode. Furthermore, most of the polymer conductors have a low atmospheric stability, and thus may be oxidized quickly in the atmosphere, thereby deteriorating the electrical conductivity. And thus, securing stability is also important.

Much research is being conducted on using CNT, graphene, and metal nano wire to manufacture a conductive transparent film, but there are many problems to be solved before using them in conductive transparent films having low resistance, and thus such research has not reached the step of commercialization yet.

Recently, in order to resolve the aforementioned problems, research is being conducted proactively in methods for forming a metal mesh type conductive transparent film using metals having excellent conductivity and mechanical strength. These methods include a method for forming fine engraved grooves using an imprinting method and filling them with metal, a method of directly etching a surface of a resin layer or a resin layer and a substrate simultaneously with laser to form fine grooves and filling the grooves with a metal layer, a method of coating a substrate with metal in a vacuum deposition or full coating method and then using a photo etching process, and a method of using a direct printing technique such as flexo, gravure, gravure offset, reverse offset, and inkjet printing etc.

BRIEF SUMMARY

Therefore, a purpose of the various embodiments of the present disclosure is to resolve the aforementioned problems of prior art, that is to provide a conductive pattern making method and a conductive pattern thereof, wherein the filling characteristics of a conductive ink composition into fine grooves have been improved, thereby reducing the number of times of repeating a filling process, and improving the overall process efficiency.

Furthermore, another purpose of the various embodiments of the present disclosure is to provide a conductive pattern making method and a conductive pattern thereof, wherein the composition ratio of a conductive ink composition may be adjusted so as to adjust the electrical characteristics, that is the desired resistance characteristics of a pattern to be finally formed.

Moreover, another purpose of the various embodiments of the present disclosure is to provide a conductive pattern making method and a conductive pattern thereof, wherein tapered shape grooves are configured to have a deeper length in the vertical direction and thus when filled with a greater amount of conductive ink composition than square or rectangular shape grooves of prior art, the transmissivity would be within a similar range, but such tapered shape grooves having a deeper length in the vertical direction would exhibit better electrical characteristics than the square or rectangular shape grooves of prior art.

Furthermore, another purpose of the various embodiments of the present disclosure is to provide a conductive pattern making method and a conductive pattern thereof, wherein grooves are configured to have tapered shapes enabling one to control the amount to be filled thereby providing various and fine line widths that could satisfy customers' needs.

Furthermore, another purpose of the various embodiments of the present disclosure is to provide a conductive pattern making method and a conductive pattern thereof, wherein grooves are configured to have tapered shapes and thus a mold used to form the grooves can be easily removed, thereby reducing the rate of defects that may occur when removing the mold, and improving the productivity.

In a general aspect, there is provided a conductive pattern making method including forming a groove such that its width in an inlet area is bigger than its width in an inner area;

filling the groove with a conductive ink composition; and drying the conductive ink composition so that a solvent contained in the conductive ink composition inside the groove is volatilized to reduce the volume of the conductive ink composition.

The cross-section of the groove may be at least one of a trapezoid, triangle, polygon consisting of sides between which the angles differ from one another, oval, semicircle, shape having a concave inner surface, and shape having a convex inner surface.

The sum of an angle between the surface of the substrate and an inner surface of the groove may be between 185° to 340°.

The method may further include refilling the groove with the conductive ink composition remaining on the surface, after the filling, and the refilling may include filling the groove by introducing the conductive ink composition remaining on the surface into the groove.

The refilling may further include applying an etching solution to the surface of the substrate in order to dissolve the conductive ink composition remaining on the surface of the substrate; and the conductive ink composition remaining on the surface of the substrate being removed by the etching solution applied.

The conductive ink composition may be a conductive metal composition including at least one of a metal plate and metal nano particle, the conductive metal composition constituting 30 weight % to 90 weight % of 100 weight % of the conductive ink composition The conductive ink composition may be a conductive metal composition including at least one of a metal complex plate and metal precursor, the conductive metal composition constituting 1 weight % to 30 weight % of 100 weight % of the conductive ink composition.

The conductive ink composition may be a conductive metal composition including at least one of a silver nanowire and carbon nanotube, the conductive metal composition constituting 1 weight % to 5 weight % of 100 weight % of the conductive ink composition.

In another general aspect, there is provided a conductive pattern including a substrate where a groove is formed such that its width in an inlet area is bigger than its width in an inner area; and a conductive ink composition with which to fill the substrate.

The cross-section of the groove may be at least one of a trapezoid, triangle, polygon consisting of sides between which the angles differ from one another, oval, semicircle, shape having a concave inner surface, and shape having a convex inner surface.

The sum of an angle between the surface of the substrate and an inner surface of the groove may be between 185° to 340°.

According to the aforementioned embodiments of the present disclosure, it is possible to provide a conductive pattern making method and a conductive pattern thereof, wherein the filling characteristics of a conductive ink composition into fine grooves have been improved, thereby reducing the number of times of repeating a filling process, and improving the overall process efficiency.

Herein, due to tapered shape grooves it is possible to easily embody a pattern of fine line widths.

Furthermore, it is possible to provide a conductive pattern making method and a conductive pattern thereof, wherein the composition ratio of a conductive ink composition may be adjusted so as to adjust the electrical characteristics, that is the desired resistance characteristics of a pattern to be finally formed.

Moreover, it is possible to provide a conductive pattern making method and a conductive pattern thereof, wherein tapered shape grooves are configured to have a deeper length in the vertical direction and thus when filled with a greater amount of conductive ink composition than square or rectangular shaped grooves of prior art, the transmissivity would be within a similar range, but such tapered shape grooves having a deeper length in the vertical direction would exhibit better electrical characteristics than the square or rectangular shaped grooves or prior art.

Furthermore, it is possible to control the width of a pattern to be finally formed by adjusting the composition ratio of the conductive ink composition.

Furthermore, it is possible to provide a conductive pattern making method and a conductive pattern thereof, wherein grooves are configured to have tapered shapes enabling one to control the amount to be filled thereby providing various and fine line widths that satisfy customers' needs.

Furthermore, it is possible to provide a conductive pattern making method and a conductive pattern thereof, wherein grooves are configured to have tapered shapes using a mold that can be easily transformed, thereby reducing the rate of defects that may occur when transforming the mold, and improving the productivity.

Based on the aforementioned, it is possible to improve the process efficiency and production speed.

BRIEF DESCRIPTION OF THE DRAWINGS

Throughout the drawings and the detailed description, unless otherwise described, the same drawing reference numerals will be understood to refer to the same elements, features, and structures. The relative size and depiction of these elements may be exaggerated for clarity, illustrating, and convenience.

DETAILED DESCRIPTION

Hereinbelow, a method for measuring a nonlinear parameter and a system thereof according to embodiments of the present disclosure will be explained in detail with reference to the drawings attached hereto.

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

Furthermore, the terms and words used herein and the claims should not be interpreted as limiting to a general or lexical meaning, but should be interpreted as having a meaning and concept that is suitable to the technical concept of the present disclosure for most suitably expressing the present disclosure.

Hereinbelow, a conductive pattern making method according to a first embodiment of the present disclosure will be explained with reference to the attached drawings.

Figure 1:
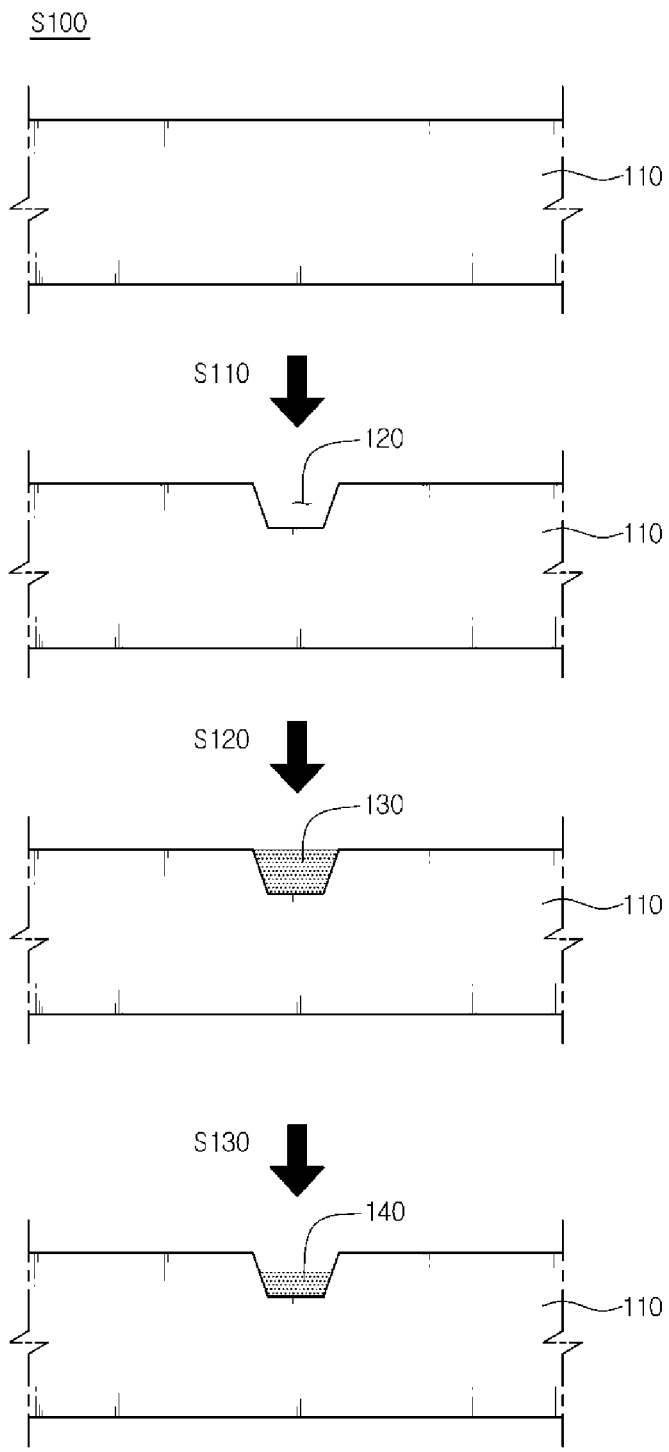
FIG. 1 is a schematic view of a conductive pattern making method according to an embodiment of the present disclosure.

FIG. 1 is a schematic view of a conductive pattern making method according to an embodiment of the present disclosure.

Referring to FIG. 1, the conductive pattern making method according to the first embodiment of the present disclosure (S100) is a process for forming a conductive pattern on a substrate with improved process efficiency, and the method includes a step of forming a groove (S110), a filling step (S120), and a drying step (S130).

Figure 3:
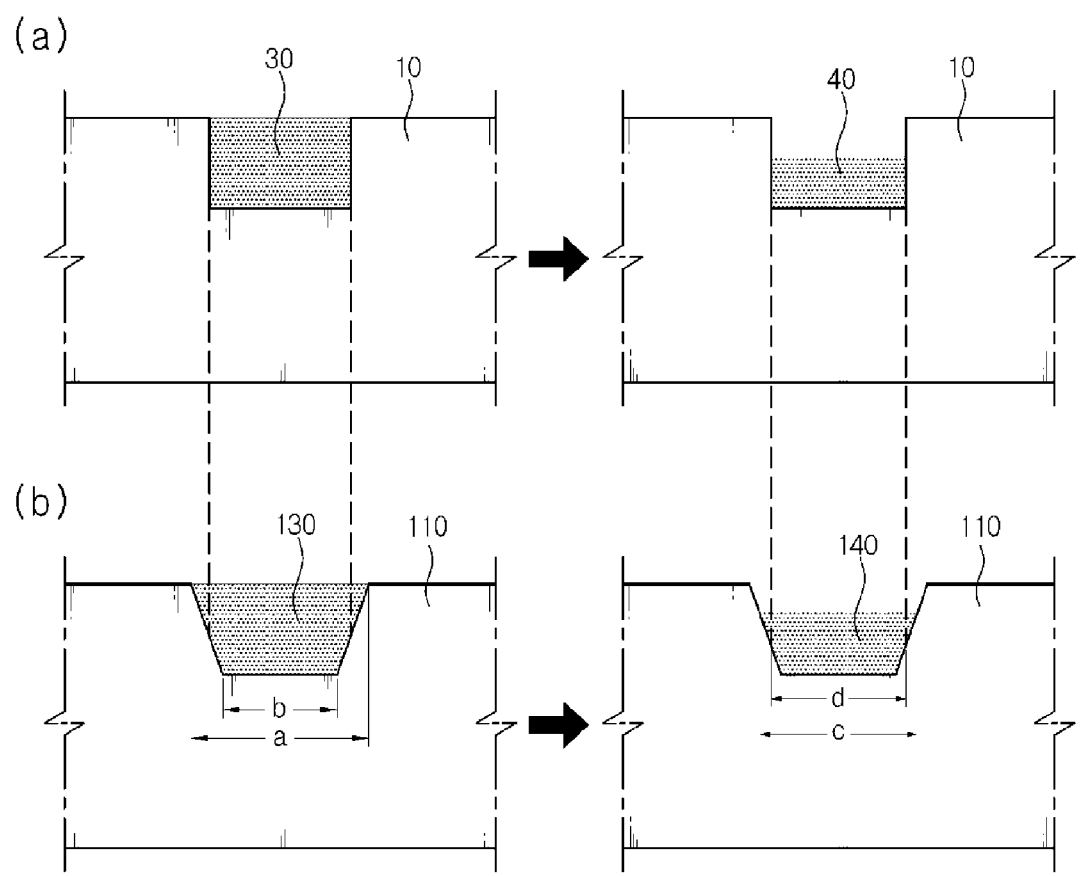
FIGS. 3a, 3b, 4a and 4b are comparative views for comparing a conductive pattern made by the conductive pattern making method of FIG. 1 with a conductive pattern made by a conventional method.

The step of forming a groove (S110) is a step of forming a fine groove 120 such that it is engraved towards the inside of a surface of a substrate. That is, as illustrated in FIG. 3, unlike a groove of which the cross-section is square shaped and has a certain width in the depth direction formed in a conventional pattern forming process of prior art, in the embodiment of the present disclosure, a groove is formed such that its width tapers along the thickness direction.

That is, the groove may be configured such that it is engraved towards the inside of the surface of the substrate 110 and its cross-section vertical to the longitudinal direction has the shape of a reversed trapezoid, but there is no limitation thereto as long as the sides of the groove are inclined.

Figure 2:
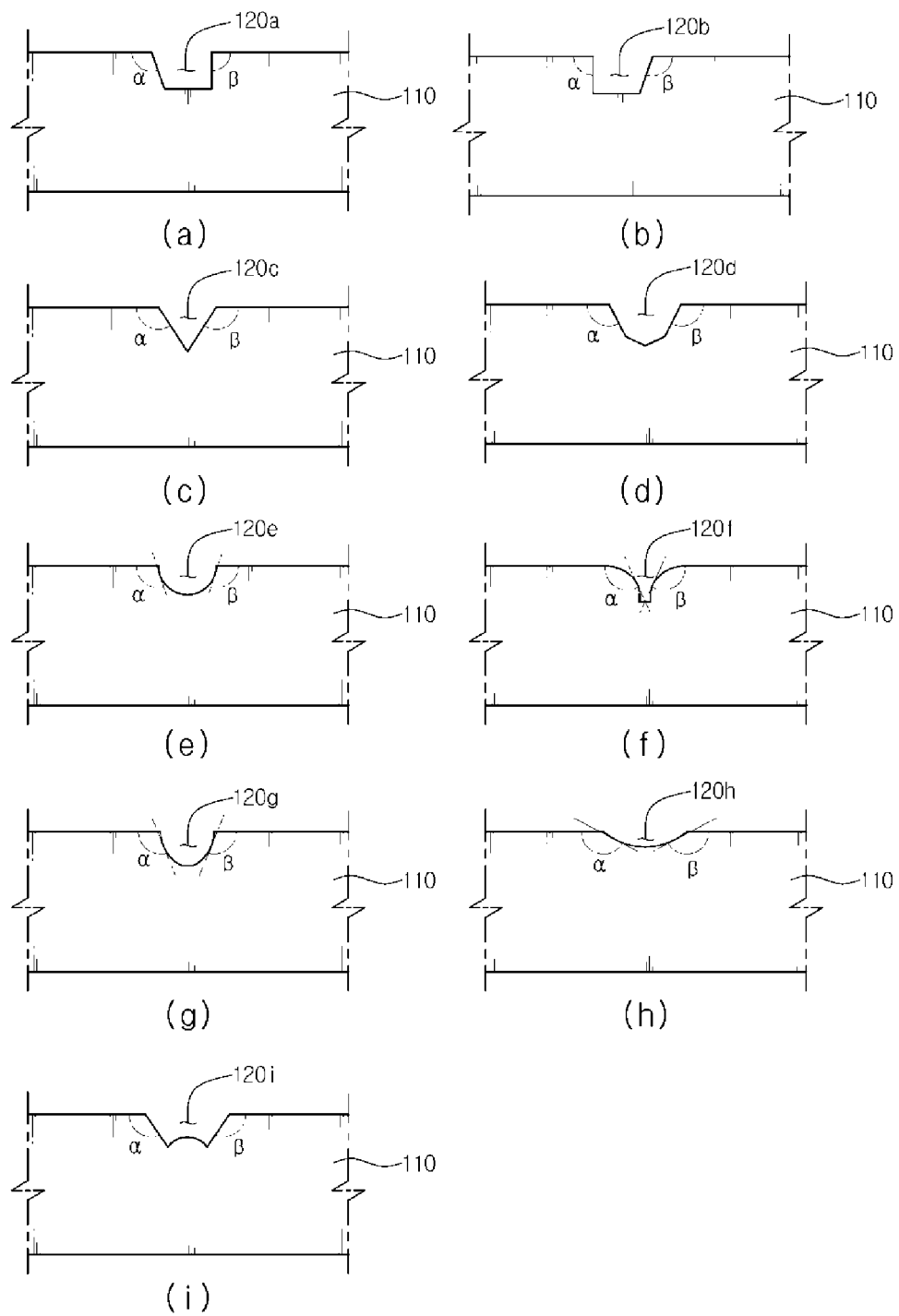
FIGS. 2a-2i are a view of various shapes of grooves that may be formed on a substrate in a conductive pattern making method according to an embodiment of the present disclosure.

FIG. 2 is a view of various shapes of grooves that may be formed on a substrate in a conductive pattern making method according to an embodiment of the present disclosure.

That is, as illustrated in FIG. 2, on the substrate according to the embodiment of the present disclosure 110, grooves of various shapes of a reversed trapezoid 120a, 120b, a reversed triangle 120c, a polygon 120d consisting of sides between which the angles differ from one another, a semicircle 120e, a shape 120f having an concave inner surface, a shape 120g having a convex inner surface, or oval shape 120h may be formed. Herein, the aforementioned groove may have a convex bottom surface 120i.

Furthermore, it is desirable that the sum of an angle between the upper surface of the substrate 110 and the two opposite sides (α, β), of the groove 120, that is (α+β), is between 185° to 340°.

Meanwhile, the substrate 110 where the groove 120 is formed at the present step may be made of a transparent material, such as a plastic film or glass. The plastic film may be polyimide (PI), polyethylene terephthalate (PET), polyethylenenaphthalate (PEN), polyethersulfone (PES), nylon, polytetrafluoroethylene (PTFE), polyetheretherketone (PEEK), polycarbonate (PC), or polyarylate (PAR). Otherwise, the plastic film may be made of an intransparent material. For example, a metal plate of which the surface has been insulated, intransparent plastic film, intransparent glass or intransparent glass fiber may be applied.

Furthermore, the substrate may be configured either as a single material layer, or as a double layered substrate where a photopolymer resin layer is laminated on a predetermined base layer.

The substrate 110 may be made of, but is not limited to, a plastic film or glass as aforementioned. That is, it is desirable that the material of the substrate 110 is determined comprehensively considering the process of forming the groove 120, the shape of the groove 120, and the type and composition ratio of the ink composition with which to fill the groove 120.

Furthermore, any general method of forming a groove on a substrate may be used at the present step that is well known to those in the art, but it is desirable to selectively use a method of imprinting a UV resin or thermosetting resin with a mold, or a photolithography method in accordance with the size of the desired fine line width, but there is no limitation thereto.

The filling step (S120) is a step of filling the groove 120 formed on the substrate 110 with a conductive ink composition 130.

That is, at the present step, the inside of the groove 120 of which the width decreases along the depth direction is filled with the conductive ink composition 130, which improves the filling rate due to changes in the shape of the groove compared to when filling a conventional groove having a constant size width, and thus it takes a less number of times to completely fill the groove 120 compared to a conventional groove having the same size.

At the present step, suitable methods for filling the groove 120 of the substrate with the conductive ink composition 130 may include, but not limited to, an inkjet method, flat panel screen method, spin coating method, bar coater method, roll coating method, flow coating method, doctor blade, dispensing, gravure printing method, and flexography printing method. Herein, filling may be repeated one or more number of times. The filling characteristics may vary depending on the filling method used, but it is necessary to optimize the rheology to the filling method used by adjusting the composition ratio of the conductive ink composition.

Furthermore, the conductive ink composition used in the present disclosure 130 may be a conductive metal composition including at least one of a metal complex compound, metal precursor, metal plate or metal nano particle, carbon nano tube (CNT), and graphene.

Furthermore, the conductive ink composition used in the present disclosure 130 may include a mixed compound of metal particles made from reducing a metal complex compound or metal precursor. Besides such a mixed compound, additives such as a solvent, stabilizer, dispersant, binder resin, reductant, surfactant, wetting agent, thixotropic agent, leveling agent, or viscosity agent may be further included.

Furthermore, the conductive ink composition used in the present disclosure 130 may include a conductive metal composition of 1 to 90 weight % and a solvent of at least 1 weight % of the total weight. More specifically, the contents to be included in the conductive ink composition may vary depending on the type of the conductive metal composition, and table 1 below is a list of examples of such contents.

TABLE 1

| | Type of conductive metal composition | Conductive metal composition of the conductive ink composition(weight %) |
|---|---|---|
| Example 1 | Metal plate, metal nano particles | 30~90 |
| Example 2 | Metal complex compound, metal precursor | 1~30 |
| Example 3 | Silver nano wire, carbon nano tube | 1~5 |

Meanwhile, the aforementioned conductive ink composition 130 is dried and contracted at the drying step (S130) that will be explained hereinafter, and the contraction rate is determined by the composition ratio of the conductive ink composition 130. Therefore, it is desirable that the composition ratio of the conductive ink composition 130 is determined comprehensively considering the electrical characteristics and optical characteristics of the conductive pattern 140 to be finally formed.

The drying step (S130) is a step of finally forming the conductive pattern 140 by drying and consolidating the conductive ink composition 130 with which the groove 120 is filled.

The drying of the conductive ink composition 130 may be performed at a temperature range of 22° C. to 600° C., and desirably 80° C. to 400° C. However, the drying temperature is not limited to the aforementioned, but it is determined considering the material of the substrate 110 and the components of the conductive ink composition 130.

After the drying step, a solvent inside the conductive ink composition 130 with which the groove 120 is filled is volatilized, leaving the groove 120 with metal solid substances and binder resin etc, and reducing the volume of the composition finally left inside the groove 120 to be smaller than the volume of the composition when the groove 120 was completely filled right after the filling step (S120). Herein, the volume reduction rate at the drying step (S130) may vary depending on the components of the conductive ink composition.

That is, by adjusting the composition ratio of the conductive ink composition 130, the volume of the conductive ink composition 130 to be left in the groove due to the volatilization of the solvent and contraction of the conductive ink composition at the drying step (S130) can be adjusted. Accordingly, it is possible to adjust the width and electrical characteristics of the final pattern to be formed based on the shape of the tapered groove and the characteristics of the contracted conductive ink composition.

Meanwhile, since the groove 120 is configured to have a tapered shape, it is easy to form a pattern having even a very fine line width such as 1 μm or below, by adjusting the composition ratio of the conductive ink composition 130 such that the conductive ink composition is left in the lower part of the groove 120 only.

Figure 4:
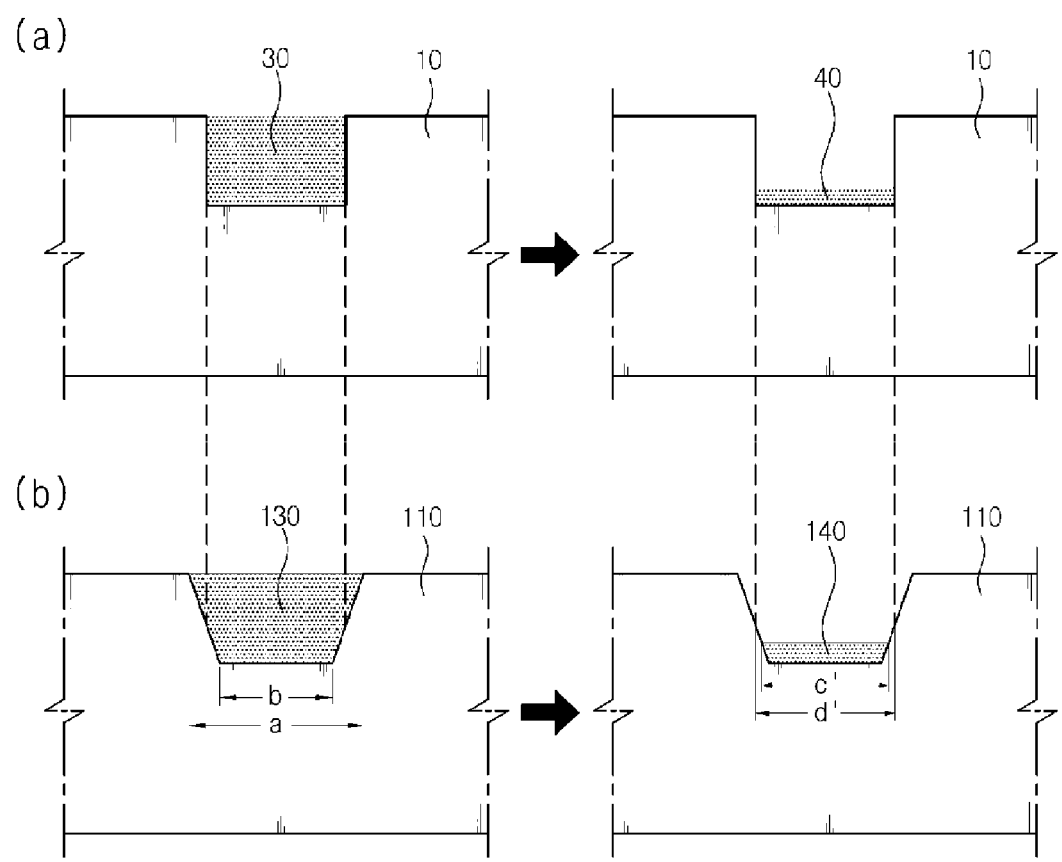

FIG. 3 and FIG. 4 are comparative views for comparing a conductive pattern made by the conductive pattern making method of FIG. 1 with a conductive pattern made by a conventional process.

Referring FIGS. 3 and 4, a comparison will be made based on an assumption that the groove 120 has the shape of a reversed trapezoid, and that 50 weight % of the conductive ink composition completely filled initially was volatilized after a drying step to form a conductive pattern 140.

First of all, as illustrated in FIG. 3, in the present embodiment, the groove 120 is configured to have a shape of which the width gradually decreases along the thickness direction, that is, wherein the width of the groove (a) in an inlet area is bigger than the width of the groove (b) in an inner area.

Hereinbelow, a comparison will be made based on an assumption that the width of an upper part of a conductive pattern 140 consolidated and formed inside the groove 120 according to the present embodiment is (c), and that the width of a conductive pattern 40 consolidated and formed inside a square shape conventional groove of which 50 weight % of the ink composition 30 has been volatilized is (d).

That is, in the case of forming a conductive pattern with what is left, that is, with 50 weight % of the conductive ink composition that completely filled the groove, when using a conventional method, the width (d) of the conductive pattern 40 will be maintained to a certain width regardless of whether or not conductive ink was volatilized, but when using the method of the present embodiment, the upper part of the groove will have a bigger width and thus a bigger volume, and thus even after when 50 weight % of the conductive ink composition is volatilized, the height of the conductive pattern 140 left will be above ½ of the groove. That is, as illustrated in FIG. 3, even when 50 weight % of the conductive ink composition 130 is volatilized, a conductive pattern 140 will be formed up to above the ½ position of the thickness of the groove. Furthermore, the width of the conductive pattern (c) formed in the present embodiment would be bigger than the width of the conductive pattern (d) formed in a conventional method.

On the other hand, in the case where more than 50 weight % of the conductive ink composition is volatilized according to the composition ratio of the components included in the conductive ink composition, as illustrated in FIG. 4, when using a conventional method, the width (d') of the conductive pattern 40 will be maintained to a certain width regardless of the volatilized amount, but when using the method of the present embodiment, the width of the conductive pattern (c') will be smaller than (d').

That is, as illustrated in FIG. 3, when not much amount is volatilized at the drying step according to the composition ratio of the components included in the conductive ink composition, the width (c) of the conductive pattern 140 formed in the method of the present embodiment may be bigger than the width (d) of the conductive pattern 40 formed in a conventional method, and thus better electrical characteristics will be exhibited.

Meanwhile, as illustrated in FIG. 4, when the composition ratio of the conductive ink composition is configured such that a large amount would be volatilized at the drying step, the width (c') of the conductive pattern formed in the method of the present embodiment will be smaller than the width (d') of the conductive pattern formed in a conventional method. In this case, a pattern having better optical characteristics will be formed compared to when using a conventional method, since the size area of transmission of the conductive pattern on the substrate 110 would be reduced thereby increasing the transparency.

In summary, according to the present disclosure, a groove 120 is configured such that its width gradually decreases along the thickness direction on the substrate 110, and the composition ratio of the components included in the conductive ink composition 130 with which the groove 120 is filled may be controlled, thereby improving the filling characteristics while maintaining the electrical characteristics and adjusting the optical characteristics to be suitable to the required designing profile.

Figure 5:
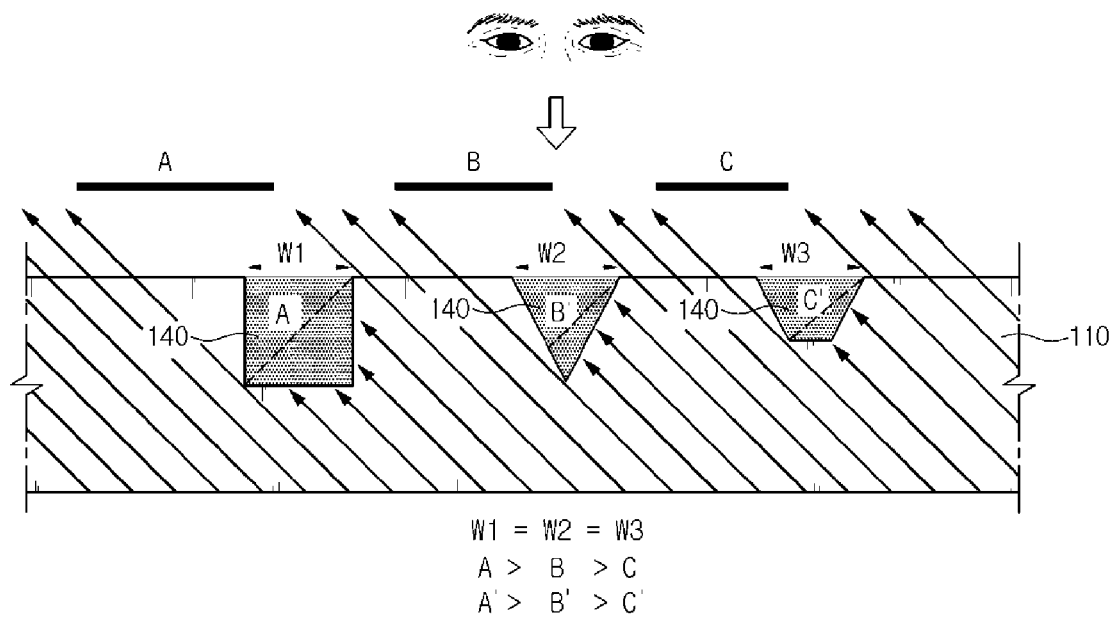
FIG. 5 is a comparative view for comparing the optical effects of a conductive pattern made by the conductive pattern making method of FIG. 1 with the optical effects of a conductive pattern made by a conventional method.

More specifically, referring to FIG. 5, a comparison will be made between the groove structure according to the present disclosure and the groove structure of a square or rectangular shape that is not a tapered shape. First of all, in the case of the tapered shape groove structure according to the present disclosure, the horizontal width is smaller than that of the square or rectangular groove structure, but the depth in the vertical direction is deeper than that of the square or rectangular groove structure, and thus when the amount of conductive ink with which the taper shaped groove is filled according to the present disclosure is almost the same as the mount of conductive ink with which the square or rectangular groove is filled, the tapered shape groove of the present disclosure may provide the electrical characteristics within the same range as the square or rectangular groove, and further, regarding the optical characteristics, such a tapered shape groove according to the present disclosure will have a significantly increased transmissivity of light than the square or rectangular groove, thereby providing better optical characteristics.

That is, even when the widths W1, W2, W3 of the groove are the same, the width A' of light blocked by a square or rectangular pattern will be bigger than the width B', C' of light blocked by a tapered shape groove according to the present disclosure, and thus better optical characteristics will be provided.

Furthermore, according to the present disclosure, since the taper shaped groove is deeper along the vertical direction, when filling the groove with a larger amount of conductive ink composition than that of a square or rectangular groove, although the transmissivity will be the same, better electrical characteristics will be provided.

Furthermore, according to the present disclosure, it is possible to reduce the number of times of filling a groove by changing the shape of the groove 120, thereby providing an effect of improved process efficiency.

Furthermore, according to the present disclosure, since grooves are configured to have tapered shapes, the mold used to form a groove can be easily removed, compared to when the mold is used to form a square or rectangular groove, thereby reducing the rate of defects that may occur when removing the mold, and improving the productivity and production speed as well.

Furthermore, unlike square or rectangular grooves that can provide only predetermined line widths, the grooves according to the present disclosure are configured to have tapered shapes enabling one to control the amount to be filled, thereby providing various and fine line widths that could satisfy customers' needs.

Hereinbelow, a conductive pattern making method according to a second embodiment of the present disclosure (S200) will be explained in detail.

Figure 6:
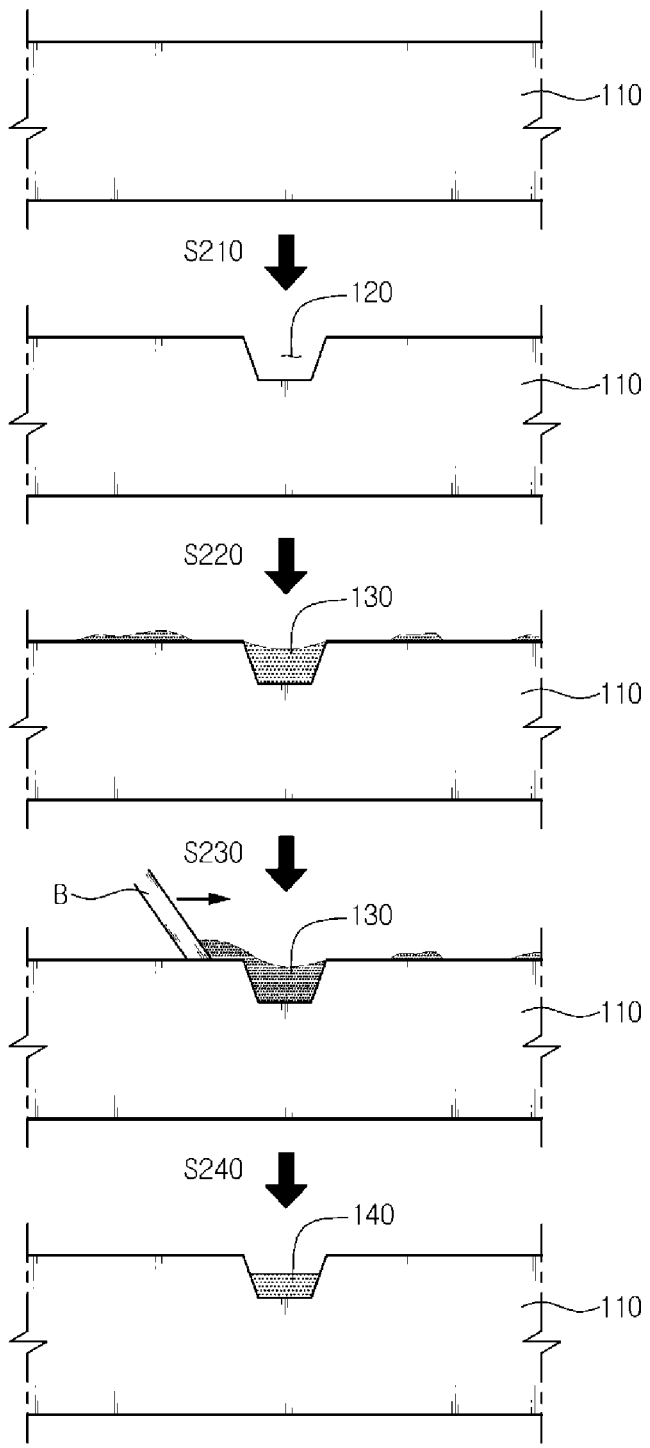
FIG. 6 is a schematic view of the process of a conductive pattern making method according to a second embodiment of the present disclosure.

FIG. 6 is a schematic view of the process of a conductive pattern making method according to a second embodiment of the present disclosure.

Referring to FIG. 6, the conductive pattern making method according to the second embodiment of the present disclosure (S200) is a process for forming a conductive pattern 140 on a substrate 110 with improved process efficiency, and the method includes a step of forming a groove (S210), filling step (S220), refilling step (S230) and drying step (S240).

However, the step of forming a groove (S210), filling step (S220), and drying step (S240) are the same as the processes explained in the first embodiment, and thus repeated explanation is omitted.

The refilling step (S230) is a step of refilling the groove 120 with a portion of the conductive ink composition 130 not filled in the groove at the filling step (S220) and remains on the surface of the substrate 110.

This step is performed by pushing the remaining conductive ink composition inside the groove 120 using a doctor blade B.

However, the refilling process of the conductive ink composition is not limited to the aforementioned process, and various methods, especially the doctor blade and brush may be used together. That is, it is possible to push the remaining conductive ink composition into the groove using the doctor blade and brush at the same time, while removing the metal material or organic material that are components of the conductive ink composition remaining on the surface of the substrate 110.

Besides the aforementioned, additional vibration, fluctuation, and/or air may be used to fill the groove 120 with the remaining conductive ink composition.

Meanwhile, it was explained above that in the present embodiment the refilling step (S230) is performed between the filling step (S220) that is before the conductive ink composition is dried and the drying step (S240), but it is also possible to perform the drying step (S240) first and then refill the groove with the conductive ink composition remaining on the substrate 110.

Hereinbelow, a conductive pattern making method according to a third embodiment of the present disclosure (S300) will be explained in detail.

Figure 7:
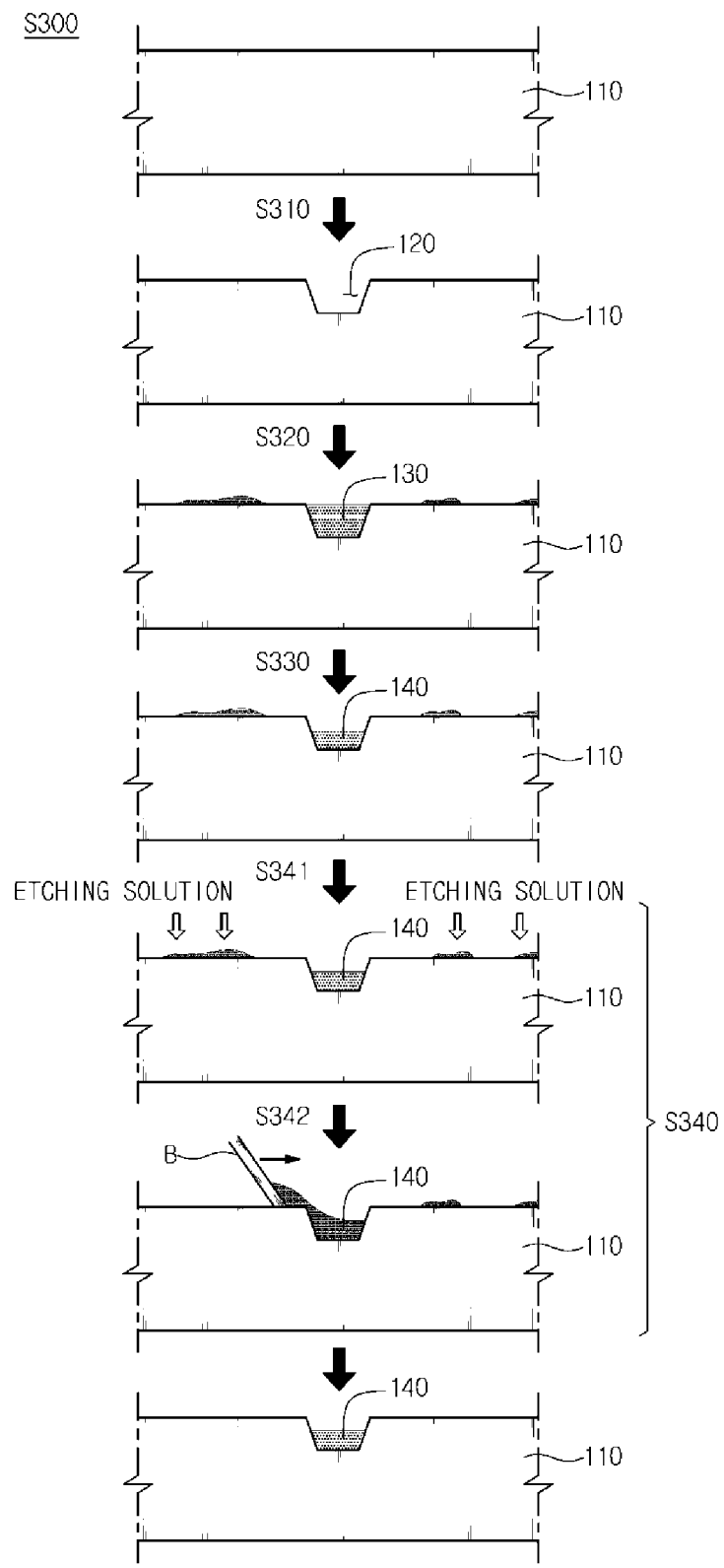
FIG. 7 is a schematic view of the process of a conductive pattern making method according to a third embodiment of the present disclosure.

FIG. 7 is a schematic view of the process of a conductive pattern making method according to a third embodiment of the present disclosure.

Referring to FIG. 7, the conductive pattern making method according to the third embodiment of the present disclosure (S300) is a process for forming a conductive pattern 140 on a substrate 110 with improved process efficiency, and the method includes a step of forming a groove (S310), filling step (S320), drying step (S330) and refilling step (S340).

However, the step of forming a groove (S310), filling step (S320), and drying step (S330) are the same as the processes explained in the first embodiment, and thus repeated explanation is omitted.

In the present embodiment, the refilling step (S340) is a step of dissolving the conductive ink composition remaining and consolidated on the substrate 110 after the drying step (S330), and then refilling the groove 120 with the dissolved conductive ink composition, thereby improving the filling rate and preventing inefficient consumption of the conductive ink composition.

That is, in the present embodiment, first of all, an etching solution is applied to the substrate 110 to dissolve the conductive ink composition. The etching solution that may be used in the present embodiment may desirably include at least one of ammonium carbamate, ammonium carbonate, ammonium bicarbonate, carboxylic acid, lactone, lactam, ring-shaped acid anhydride, acid-base salt complex, acid-base-alcohol complex, and mercapto; and an oxidizer.

For example, an oxidizer may be reacted with one or more of the aforementioned compounds and their mixtures either without a solvent under atmospheric or pressurized environment, or with a solvent, for example, such as water; alcohol such as methanol, propanol, isopropanol, butanol, and ethanolamine; glycol such as ethyleneglycol, and glycerin; acetate such as ethylacetate, butyl acetate, and carbitolacetate; ether such as diethylether, tetrahydrofuran, and dioxane; ketone such as methylethylketone, and acetone;

hydrocarbon such as hexane, and heptane; aromatic group such as benzene and toluene; halogen substituent solvent such as chloroform, methylenechloride, and carbontetrachloride; and fluoro based solvent such as perfluorocarbon; and mixed solvent thereof. Under pressurized environment such as in a pressurized container, a low boiling point fluoro based solvent or liquefied carbonic acid gas may be used as well. There is no need to limit the method of making an etching solution of the present disclosure. That is, any well-known method may be used as long as it is suitable to the purposes of the present disclosure.

As an etching solution, the oxidizer may include an oxidative gas such as oxygen and ozone; peroxide such as $H_2O_2$, $Na_2O_2$, $KO_2$, $NaBO_3$, $(NH_4)S_2O_8$, $H_2SO_5$, $(CH_3)_3CO_2H$, and $(C_6H_5CO_2)_2$; hyperoxidative acid such as $HCO_3H$, $CH_3CO_3H$, $CF_3CO_3H$, $C_6H_5CO_3H$, and $m-ClC_6H_5-CO_3H$; generally well known oxidative inorganic acid, metal or nonmetal compound such as nitric acid, sulfuric acid, iodine ($I_2$), $Fe(NO_3)_3$, $Fe_2(SO_4)_3$, $K_3Fe(CN)_6$, $(NH_4)_2Fe(SO_4)_2$, $Ce(NH_4)_4(SO_4)_4$, $NaIO_4$, $KMnO_4$, and $K_2CrO_4$. These oxidizers may be used individually or mixed with at least another oxidizer and then used.

It may be desirable to apply hydrophilic characteristics to an etching solution so that it dissolves the conductive ink remaining on the surface of the substrate and increase the refilling capability into fine grooves. It is desirable to adjust the extent of the hydrophilic characteristics by adjusting the carbon number of ammonium carbamate, ammonium carbonate, ammonium bicarbonate, carboxylic acid, lactone, lactam, ring-shaped acid anhydride, acid-base salt complex, acid-base-alcohol complex, or mercapto compound.

Herein, ammonium carbamate compound, ammonium carbonate compound, and ammoniumbicarbonate compound are explained in detail in Korean Patent Registration no. 0727466, and the carboxylic acid compound that may be used herein may be benzoic acid, oleic acid, propionic acid, maleic acid, hexanoic acid, octanoic acid, decanoic acid, neodecanoic acid, oxalic acid, citric acid, salicylic acid, stearic acid, acrylic acid, succinic acid, adipic acid, glycolic acid, isobutyric acid, or ascorbic acid.

Suitable lactone compounds that may be used herein include β-propiolactone, γ-propiolactone, γ-butyrolactone, γ-thiobutyrolactone, α-methyl-γ-butyrolactone, β-methyl-γ-butyrolactone, γ-valerolactone, γ-caprolactone, γ-octanoic-lactone, δ-valerolactone, 1,6-dioxaspiro[4,4]nonane-2,7-di-one, α-methylene-γ-butyrolactone, γ-methylene-γ-butyrolactone, ε-caprolactone, lactide, glycolide, tetronic acid, 2(5H)-furanone, β-hydroxy-γ-butyrolactone, mevaloniclactone, and 5,6-dihydro-2H-pyran-2-pyran-2-one etc.

Suitable lactam compounds that may be used herein include 2-azetidinone, 2-pyrolydinone, 5-methoxy-2-pyrrolidinone, 5-methyl-2-pyrrolidinone, N-methylcaprolactam, 2-azacyclononanone, and N-acetylcaprolactam etc.

Suitable ring-shaped acid anhydride compounds that may be used herein include itaconic anhydride, succinic anhydride, maleic anhydride, glutaric anhydride, octadecylsuccinicanhydride, 2,2-dimethylsuccinicanhydride, 2-dodecene-1-ylsuccinicanhydride, hexafluoroglutaricanhydride, 3,3-dimethylglutaricanhydride, 3-ethyl-3-methyl glutaric anhydride, and 3,5-diacethyltetrahydropiran-2,4,6-trione, and diglycolic anhydride etc.

Suitable mercapto compounds that may be used herein include, but are not limited to, 1-methanethiol, 1-ethanethiol, 2-butanethiol, 1-heptanethiol, 1-octanethiol, 1-decanethiol, 1-hexadecanethiol, thioacetic acid, 6-mercaptohexanoic acid, thiobenzoic acid, furfuryl mercaptan, cyclohexanethiol, 11-mercapto-1 undecanol, 2-mercaptoethanol, 3-mercapto-1-propanol, thiosalicylic acid, 1-thioglycerol, 2-naphthalenethiol, methyl 3-mercaptopropionate, and γ mercapto propyltrimethoxysilane etc. Either only one compound or a mixture of two or more compounds may be used.

The etching speed of the etching composition may desirably be adjusted by adjusting the depositing time of the etching solution or by adjusting the concentration of the oxidizer or ammonium carbamate, ammonium carbonate, ammonium bicarbonate, carboxylic acid, lactone, lactam, ring-shaped acid anhydride, acid-base salt complex, acid-base-alcohol complex, or mercapto compound, and the etching process may be repeated if necessary. Furthermore, when using an etching solution that contains inorganic acid or base, the inorganic acid or base may be removed by washing the etching solution with additional water or an organic solvent. That is, an additional washing process may be included in the etching process before filling the groove on the surface of the substrate with the conductive ink composition.

After dissolving the conductive ink composition 130 with which the groove 120 hasn't been filled but remains on the surface of the substrate 110 by applying an etching solution having the aforementioned composition to the substrate 110 in order to obtain liquidity of the conductive ink composition 130, it is possible to refill (S342) the groove 120 with the remaining conductive ink composition 130 through a process such as the doctor blade process explained with reference to the second embodiment, thereby minimizing unnecessary consumption of the conductive ink composition 130.

Furthermore, although not explained in the aforementioned embodiments, it is also possible to make the surface of the substrate 110 hydrophobic using plasma and so forth before the step of forming a groove 120 on the substrate 110, thereby improving the liquidity of the conductive ink composition on the surface of the substrate 110.

A number of examples have been described above. Nevertheless, it will be understood that various modifications may be made. For example, suitable results may be achieved if the described techniques are performed in a different order and/or if components in a described system, architecture, device, or circuit are combined in a different matter and/or replaced or supplemented by other components or their equivalents. Accordingly, other implementations are within the scope of the following claims.

DESCRIPTION OF REFERENCE NUMERALS

110: SUBSTRATE
120: GROOVE
130: CONDUCTIVE INK COMPOSITION
140: CONDUCTIVE PATTERN

What is claimed is:
1. A conductive pattern making method comprising:
   forming a groove such that its width in an inlet area is bigger than its width in an inner area;
   filling the groove with a conductive ink composition; and
   drying the conductive ink composition so that a solvent contained in the conductive ink composition inside the groove is volatilized to reduce the volume of the conductive ink composition,
   wherein the method further comprises refilling the groove with the conductive ink composition remaining on the surface, after the filling or the drying, and wherein the refilling comprises:
applying an etching solution to the surface of the substrate in order to dissolve the conductive ink composition remaining on the surface of the substrate; and
refilling the groove by introducing the dissolved conductive ink composition remaining on the surface into the groove;
wherein the etching solution comprises at least one of ammonium carbamate, ammonium carbonate, ammonium bicarbonate, carboxylic acid, lactone, lactam, ring-shaped acid anhydride, acid-base salt complex, acid-base-alcohol complex, and mercapto compound;
wherein the etching solution further comprises an oxidizer,
wherein the etching solution has hydrophilic characteristics such that the etching solution dissolves the conductive ink remaining on the surface of the substrate and increases the refilling capability into the groove, and
wherein an extent of the hydrophilic characteristics of the etching solution is adjusted by adjusting the carbon number of the ammonium carbamate, the ammonium carbonate, the ammonium bicarbonate, the carboxylic acid, the lactone, the lactam, the ring-shaped acid anhydride, the acid-base salt complex, the acid-base-alcohol complex, or the mercapto compound.

2. The method according to claim 1, wherein the cross-section of the groove is at least one of a trapezoid, triangle, polygon consisting of sides between which the angles differ from one another, oval, semicircle, shape having a concave inner surface, and shape having a convex inner surface.

3. The method according to claim 2, wherein the bottom surface of the groove is convex.

4. The method according to claim 2, wherein the sum of an angle between the surface of the substrate and an inner surface of the groove is between 185° to 340°.

5. The method according to claim 1, wherein the conductive ink composition is a conductive metal composition comprising at least one of a metal plate and metal nano particle, the conductive metal composition constituting 30 weight % to 90 weight % of 100 weight % of the conductive ink composition.

6. The method according to claim 1, wherein the conductive ink composition is a conductive metal composition comprising at least one of a metal complex plate and metal precursor, the conductive metal composition constituting 1 weight % to 30 weight % of 100 weight % of the conductive ink composition.

7. The method according to claim 1, wherein the conductive ink composition is a conductive metal composition comprising at least one of a silver nanowire and carbon nanotube, the conductive metal composition constituting 1 weight % to 5 weight % of 100 weight % of the conductive ink composition.

8. The method according to claim 1, wherein the filling comprises adjusting the rate of the solvent in the conductive ink composition with which to fill the groove, in order to adjust the volume of the conductive ink composition with which the groove is filled after the drying.

* * * * *